United States Patent

Chen

(10) Patent No.: US 9,202,771 B2
(45) Date of Patent: Dec. 1, 2015

(54) SEMICONDUCTOR CHIP STRUCTURE

(71) Applicant: LEXTAR ELECTRONICS CORPORATION, Hsinchu (TW)

(72) Inventor: Yi-Jyun Chen, Chiayi County (TW)

(73) Assignee: Lextar Electronics Corporation, Hsinchu (TW)

( * ) Notice: Subject to any disclaimer, the term of this patent is extended or adjusted under 35 U.S.C. 154(b) by 0 days.

(21) Appl. No.: 14/271,390

(22) Filed: May 6, 2014

(65) Prior Publication Data

US 2015/0097207 A1   Apr. 9, 2015

(30) Foreign Application Priority Data

Oct. 4, 2013   (TW) .............................. 102135960 A

(51) Int. Cl.
*H01L 23/34* (2006.01)
*H01L 23/38* (2006.01)

(52) U.S. Cl.
CPC ......... *H01L 23/38* (2013.01); *H01L 2924/0002* (2013.01)

(58) Field of Classification Search
CPC ......... H01L 23/38; H01L 24/83; H01L 24/85; H01L 24/81; H01L 23/48; H01L 23/482; H01L 23/481; H01L 23/522; H01L 23/535; H01L 35/00; H01L 35/28; H01L 35/14; H01L 35/26
See application file for complete search history.

(56) References Cited

U.S. PATENT DOCUMENTS

| 9,059,363 B2 * | 6/2015 | McCann .............................. 1/1 |
| 2006/0261351 A1 * | 11/2006 | Nakazato et al. ............... 257/79 |
| 2009/0173932 A1 * | 7/2009 | Ohta et al. ...................... 257/15 |

FOREIGN PATENT DOCUMENTS

| JP | 11-214598 | 8/1999 |
| JP | 2006-294782 A | 10/2006 |
| JP | 2007-507909 A | 3/2007 |
| JP | 2008-526035 A | 7/2008 |

OTHER PUBLICATIONS

Japan Patent Office, Office Action, Patent Application Serial No. 2014-170211, Sep. 29, 2015, Japan.

* cited by examiner

*Primary Examiner* — Victor A Mandala

(57) ABSTRACT

A semiconductor chip structure including a semiconductor chip having a pair of electrodes is disclosed. The electrodes have different conductivity types for electrical connection, respectively. A thermoelectric cooling material layer is disposed within each of the pair of electrodes, respectively.

10 Claims, 7 Drawing Sheets

SEMICONDUCTOR CHIP STRUCTURE

CROSS REFERENCE TO RELATED APPLICATIONS

This Application claims priority of Taiwan Patent Application No. 102135960, filed on Oct. 4, 2013, the entirety of which is incorporated by reference herein.

BACKGROUND OF THE INVENTION

1. Field of the Invention

The invention relates to a semiconductor technology, and in particular to a semiconductor chip structure having a thermoelectric (TE) cooler material.

2. Description of the Related Art

Typical semiconductor chips, such as light-emitting diodes, include a face-up chip and a flip chip. Since a thermal conductive layer inside of the semiconductor chip is adjacent to an electrode layer of the flip chip, heat is easily conducted to the electrode layer having high thermal conductivity. Therefore, the flip chip has better heat dissipation capability, such that the chip has a lower inner temperature, and the flip chip can be overdriven to reduce manufacturing costs.

However, the efficiency droop effect still occurs in the flip chip, and the excess heat is difficult to dissipate and is accumulated inside of the semiconductor chip. Accordingly, the lifespan of the chip is reduced.

Thus, there exists a need in the art for development of a semiconductor chip structure capable of mitigating or eliminating the aforementioned problems.

BRIEF SUMMARY OF THE INVENTION

A detailed description is given in the following embodiments with reference to the accompanying drawings. A semiconductor chip structure is provided.

An exemplary embodiment of a semiconductor chip structure comprises a semiconductor chip having a pair of electrodes. The electrodes have different conductivity types for electrical connection. A thermoelectric cooling material layer is disposed within each of the pair of electrodes.

According to the embodiments, the semiconductor chip structure comprises the thermoelectric cooling material layers respectively disposed within a P-type electrode and an N-type electrode. Cold-ends of the thermoelectric cooling material layers are adjacent to a surface of the semiconductor chip which is adjacent to a thermal conductive layer, such that the heat can be conducted from the interior of the semiconductor chip structure to the cold-ends of the thermoelectric cooling material layers. Moreover, the heat can be further conducted to the hot-ends of the thermoelectric cooling material layers by active heat conduction. As a result, the heat is dissipated from the interior of the semiconductor chip structure quickly and outwardly, thereby efficiently reducing the inner temperature of the semiconductor chip structure. Accordingly, operating efficiency of the semiconductor chip structure is increased, and the lifespan thereof is increased.

In addition, the semiconductor chip structure does not need to be coupled to a heat dissipation structure by an additional substrate, such that size of the semiconductor chip structure is prevented from being increased, and interfaces between the thermoelectric cooling material layers and the semiconductor chip are decreased. Therefore, heat absorption capability of the thermoelectric cooling material layers is upgraded, and maximum light output per unit area of the semiconductor chip structure is improved.

According to the embodiments, the length and the contact area of the thermoelectric cooling material layer can be adjusted according to the operating current and the thermoelectric cooling material, to control the desired cold-end temperature and the desired hot-end temperature, thereby obtaining better heat absorption capability of the thermoelectric cooling material layer.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1A:
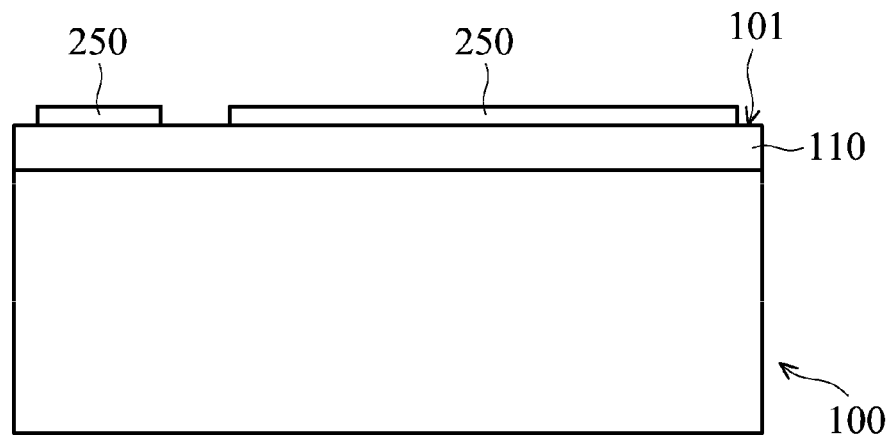
FIGS. 1A to 1C are cross-sectional views of an exemplary embodiment of a method for forming a semiconductor chip structure according to the invention.

The following description is of a mode for carrying out the invention. This description is made for the purpose of illustrating the general principles of the invention and should not be taken in a limiting sense. The scope of the invention is best determined by reference to the appended claims. Moreover, the same or similar elements in the drawings and the description are labeled with the same reference numbers.

Figure 1B:
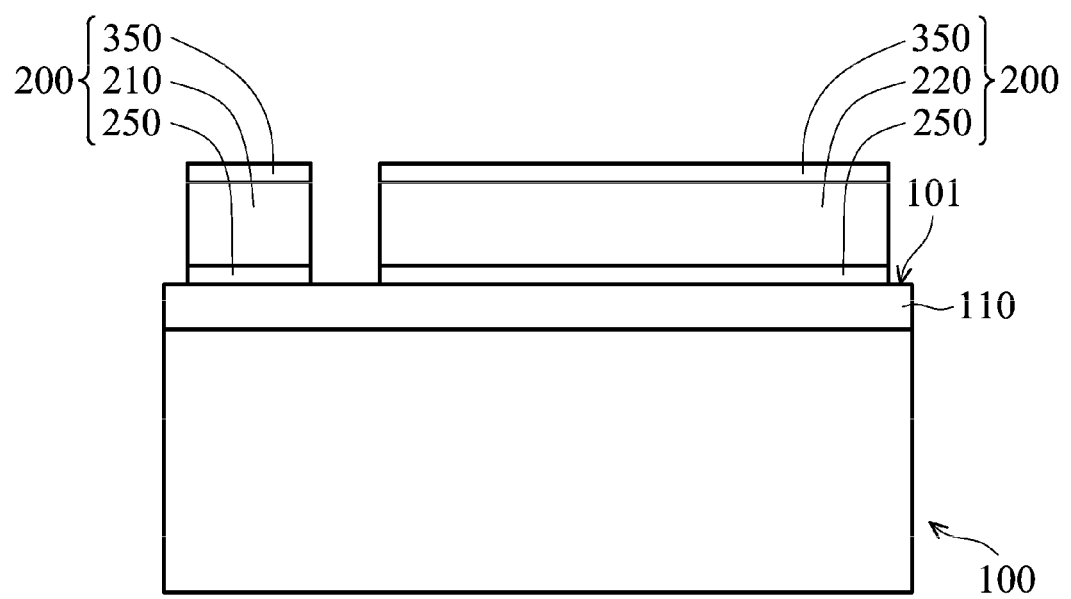
Figure 1C:
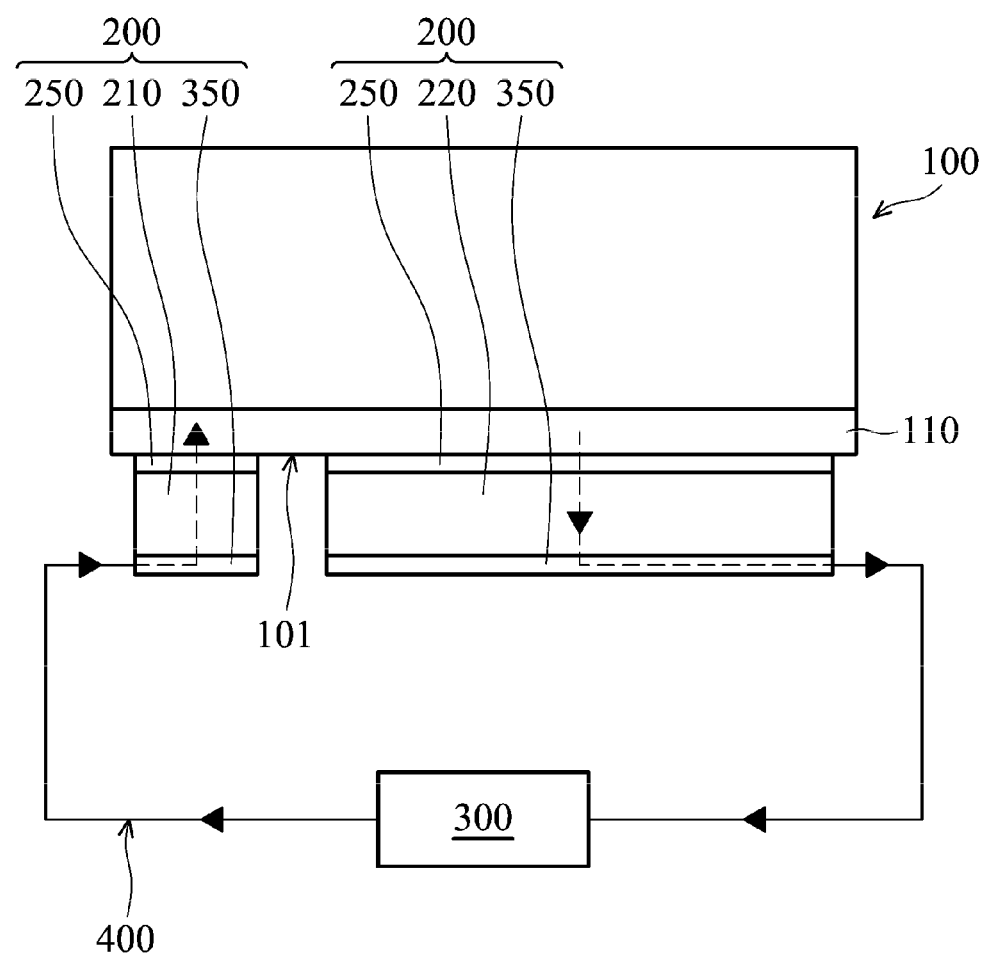

FIGS. 1A to 1C are cross-sectional views of an exemplary embodiment of a method for forming a semiconductor chip structure according to the invention. Referring to FIG. 1A, a semiconductor flip chip 100 is provided. The semiconductor flip chip 100 has a thermal conductive layer 110 adjacent to a surface 101 of the semiconductor chip 100. The semiconductor chip 100 may be a light-emitting diode chip or a high-voltage flip chip.

A conductive material layer may be formed on the surface 101 of the semiconductor chip 100 by a deposition process. The conductive material layer may comprise a single layer or multiple layers. Next, a first patterned hard mask layer (not shown) is formed on the conductive material layer. An etching process, such as a dry etching process, a wet etching process, a plasma etching process, a reactive ion etching (RIE) process or another suitable etching process, is performed on the conductive material layer using the first hard mask layer to form a patterned wire layer 250. In one embodiment, the wire layer 250 may comprise eutectic metal layers.

Referring to FIG. 1B, after the first hard mask layer is removed, a thermoelectric cooling material is formed on the wire layer 250 by a deposition process, such as an electroplating process, a sputter process, a silk printing process or another suitable deposition process. Next, a second patterned hard mask layer (not shown) is formed on the thermoelectric cooling material. An etching process, such as a dry etching process, a wet etching process, a plasma etching process, a reactive ion etching process or another suitable etching process, is performed on the thermoelectric cooling material using the second hard mask layer to form thermoelectric cooling material layers 210 and 220. In the embodiment, the thermoelectric cooling material layers 210 and 220 may comprise BiSb, $Bi_2Te_3$, PbTe, $CeFe_{4-x}Co_xSb_{12}$, SiGe or the like.

Compatibilities between the semiconductor chip and other metal materials are different from those between the thermoelectric cooling material and the other metal materials, such that bonding the semiconductor chip and the thermoelectric cooling material to each other would induce a lattice mismatch problem. Therefore, the wire layer 250 is composed of multiple layers of different materials. For example, the wire layer 250 may comprise titanium and tantalum.

Next, after the second hard mask layer is removed, doping processes, such as implantation processes, may be respectively performed on the thermoelectric cooling material layers 210 and 220 by P-type dopants, such as boron or $BF_2$, and N-type dopants, such as phosphorous or arsenic, such that the thermoelectric cooling material layer 210 has a P-type conductivity and the thermoelectric cooling material layer 220 has an N-type conductivity. In other embodiments, the thermoelectric cooling material layer 210 has an N-type conductivity and the thermoelectric cooling material layer 220 has a P-type conductivity.

Next, an adhesive material may be formed on the thermoelectric cooling material layers 210 and 220 by a deposition process. A third patterned hard mask layer (not shown) is formed on the adhesive material. An etching process is performed using the third hard mask layer on the adhesive material to form a patterned adhesive layer 350. The adhesive layer 350 may comprise a single layer or multiple layers, and comprise a conductive material, such as AuSn, SnCu, SnInBi, Bi or NiSn alloys.

In the embodiment, the thermoelectric cooling material layers 210 and 220 are interposed between the wire layer 250 and the adhesive layer 350. A P-type electrode is composed of the wire layer 250, the thermoelectric cooling material layer 210 and the adhesive layer 350, and an N-type electrode is composed of the wire layer 250, the thermoelectric cooling material layer 220 and the adhesive layer 350. The P-type electrode and the N-type electrode are configured to be a pair of electrodes 200 for electrical connection.

Next, referring to FIG. 1C, a power unit 300 is electrically connected to the P-type electrode and the N-type electrode of the pair of electrodes 200 to construct the same electrical circuit 400. In one embodiment, the adhesive layer 350 may be electrically connected to other external circuits or packages (not shown).

According to the embodiments, the semiconductor flip chip structure comprises the thermoelectric cooling material layers 210 and 220 respectively disposed within the P-type electrode and the N-type electrode of the pair of electrodes 200. When the power unit 300 is turned on, current flows from the power unit 300 to the thermal conductive layer 110 of the semiconductor chip 100 through the P-type thermoelectric cooling material layer 210 within the pair of electrodes 200, and further flow back to the power unit 300 through the N-type thermoelectric cooling material layer 220 within the pair of electrodes 200, as shown in FIG. 1C. Meanwhile, one end of the thermoelectric cooling material layer 210/220 forms a cold-end, and the other end of the thermoelectric cooling material layer 210/220 forms a hot-end. The thermoelectric cooling material layers 210 and 220 are capable of being operating in active heat conduction, and forcing the heat to be conducted from the cold-end having the relative low temperature to the hot-end having the relative high temperature. Namely, the adhesive layers 350 attached on the cold-ends of the thermoelectric cooling material layers 210 and 220 can have different temperatures from that of the wire layer 250 attached on the hot-ends of the thermoelectric cooling material layers 210 and 220 by the thermoelectric cooling material layers 210 and 220 within the pair of electrodes 200.

In the embodiment, a direction of heat conduction through the P-type thermoelectric cooling material layer 210 is opposite to a direction of current flow through the P-type thermoelectric cooling material layer 210, and a direction of heat conduction through the N-type thermoelectric cooling material layer 220 is the same as a direction of current flow through the N-type thermoelectric cooling material layer 220.

The cold-ends of the thermoelectric cooling material layers 210 and 220 are adjacent to the surface 101 of the semiconductor chip 100 which is adjacent to the thermal conductive layer 110, such that the heat can be conducted from the interior of the semiconductor chip structure to the cold-ends of the thermoelectric cooling material layers 210 and 220. Moreover, the heat can be further conducted to the hot-ends of the thermoelectric cooling material layers 210 and 220 by the active heat conduction. As a result, the heat is quickly dissipated outward from the interior of the semiconductor chip structure, thereby efficiently reducing the inner temperature of the semiconductor chip structure. Accordingly, the operating efficiency of the semiconductor chip structure is increased, and the lifespan thereof is increased.

In addition, since the thermoelectric cooling material layers 210 and 220 are disposed within the pair of electrodes 200 of the semiconductor chip 100, and the thermoelectric cooling material layers 210 and 220, the semiconductor chip 100 and the power unit 300 construct the same electrical circuit 400, the semiconductor chip structure does not need to be connected to a heat dissipation structure by an additional substrate. Therefore, the size of the semiconductor chip structure is prevented from being increased. Moreover, since the thermoelectric cooling material layers are connected to the semiconductor chip without an additional substrate, the interfaces between the thermoelectric cooling material layers and the semiconductor chip are decreased. Therefore, the heat absorption capability of the thermoelectric cooling material layers is upgraded, and the maximum light output per unit area of the semiconductor chip structure is improved.

Figure 6:
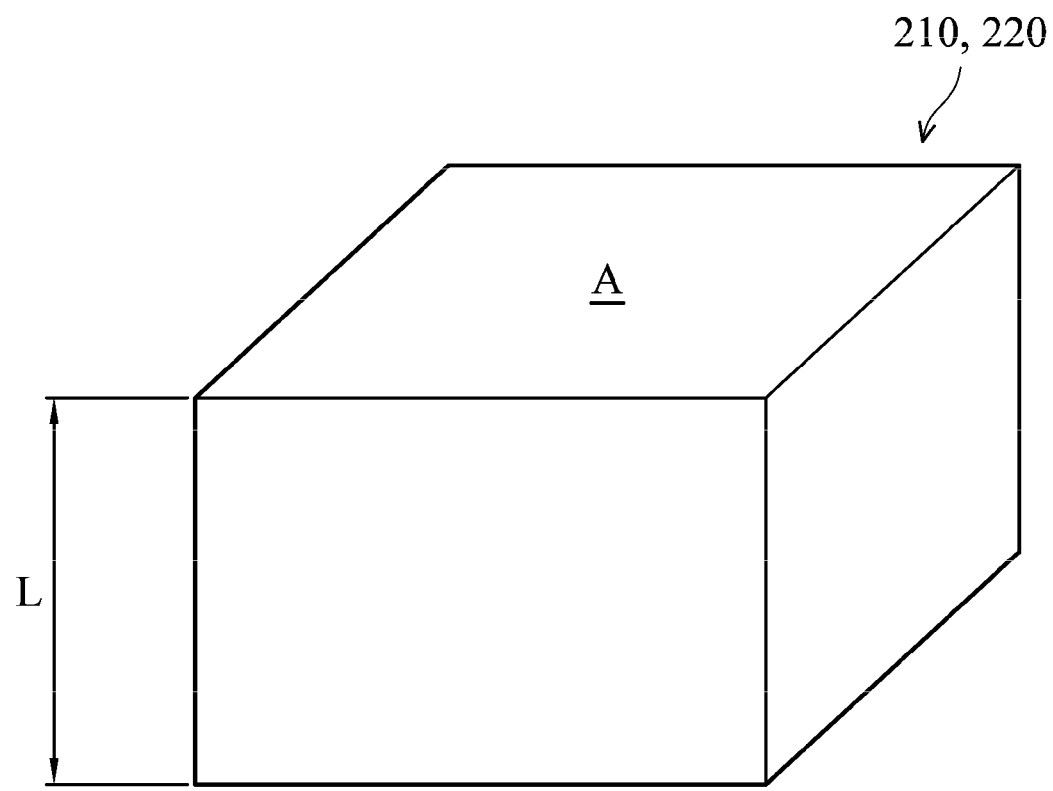
FIG. 6 is a perspective view of a thermoelectric cooling material layer.

According to the embodiments, the thermoelectric cooling material layers 210 and 220 have an operating current $I_{opt}$ in a range of $$\frac{\alpha T_c - \sqrt{(\alpha T_c)^2 - 2k\rho} \, \Delta T}{\rho} < I_{opt} \times L/A < \frac{\alpha T_c + \sqrt{(\alpha T_c)^2 - 2k\rho} \, \Delta T}{\rho},$$

wherein L represents a length of the thermoelectric cooling material layer 210/220, A represents a contact area between the thermoelectric cooling material layer 210/220 and another layer (as shown in FIG. 6), $T_c$ represents a cold-end temperature, $T_h$ represents a hot-end temperature, α represents a seeback coefficient, ΔT represents a temperature difference between $T_c$ and $T_h$ (i.e., $T_h - T_c$), ρ represents a resistivity of the thermoelectric cooling material layer 210/220, and k represents a thermal conductivity of the thermoelectric cooling material layer 210/220. According to the operating current and the material of the thermoelectric cooling material layer 210/220, the length L and the contact area A of the thermoelectric cooling material layer 210/220 can be adjusted to control the desired cold-end temperature $T_c$ and the desired hot-end temperature $T_h$ so as to obtain the better heat absorption capability of the thermoelectric cooling material layer 210/220.

In the embodiment, the thermoelectric cooling material layers 210 and 220 may comprise a single layer or multiple layers. For example, the thermoelectric cooling material layers 210 and 220 are composed of multiple thermoelectric cooling material layers bonding to each other using ceramic substrates or other suitable materials so as to provide a surface having a uniform temperature. The multiple thermoelectric cooling material layers can increase the temperature difference ΔT between the cold-end and the hot-end, thereby improving the heat absorption capability.

Figure 3:
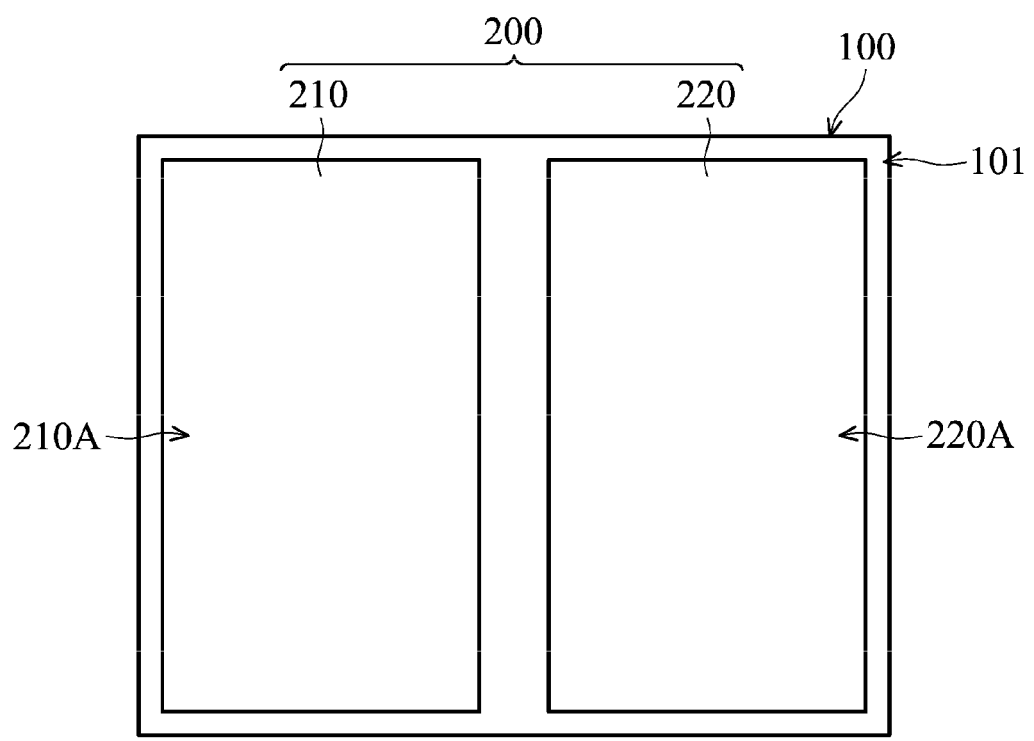
Figure 4:
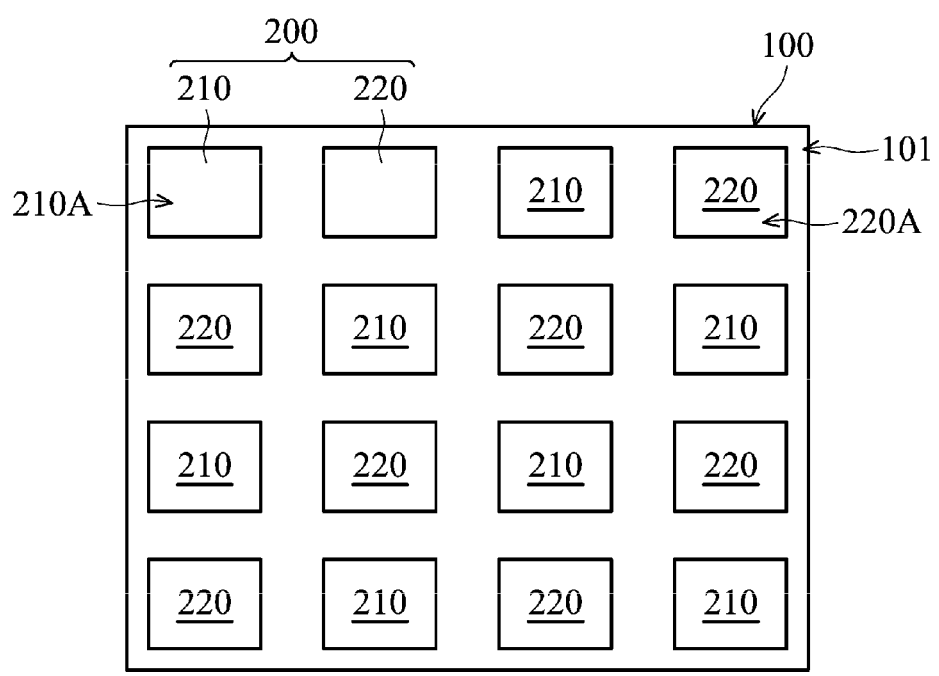
Figure 5A:
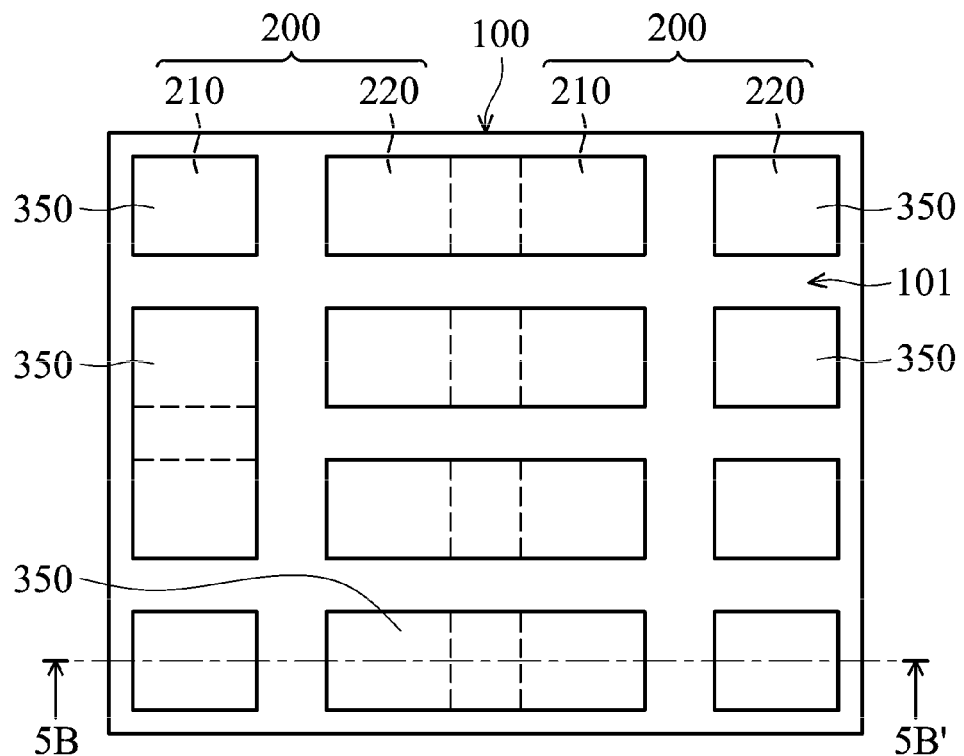
Figure 5B:
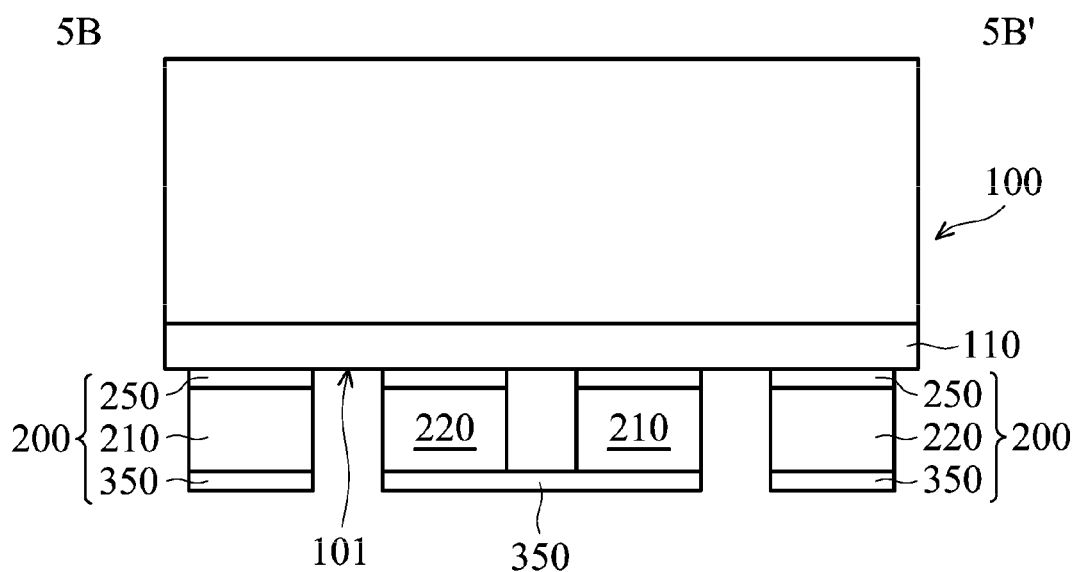
FIG. 5B is a cross-sectional view along the line 5B-5B' in FIG. 5A.

FIGS. 2 to 4 and 5A are top-views of various exemplary embodiments of a semiconductor chip structure according to the invention, and FIG. 5B is a cross-sectional view along the line 5B-5B' in FIG. 5A, wherein elements in FIGS. 2 to 4, 5A and 5B that are the same as those in FIGS. 1A to 1C are labeled with the same reference numbers as in FIGS. 1A to 1C and are not described again. In order to clearly show the relative positions of elements in the semiconductor chip structure, the adhesive layer 350, the power unit 300 and the electrical circuit 400 are not illustrated in FIGS. 2 to 4, and the power unit 300 and the electrical circuit 400 are not illustrated in FIGS. 5A and 5B.

Figure 2:
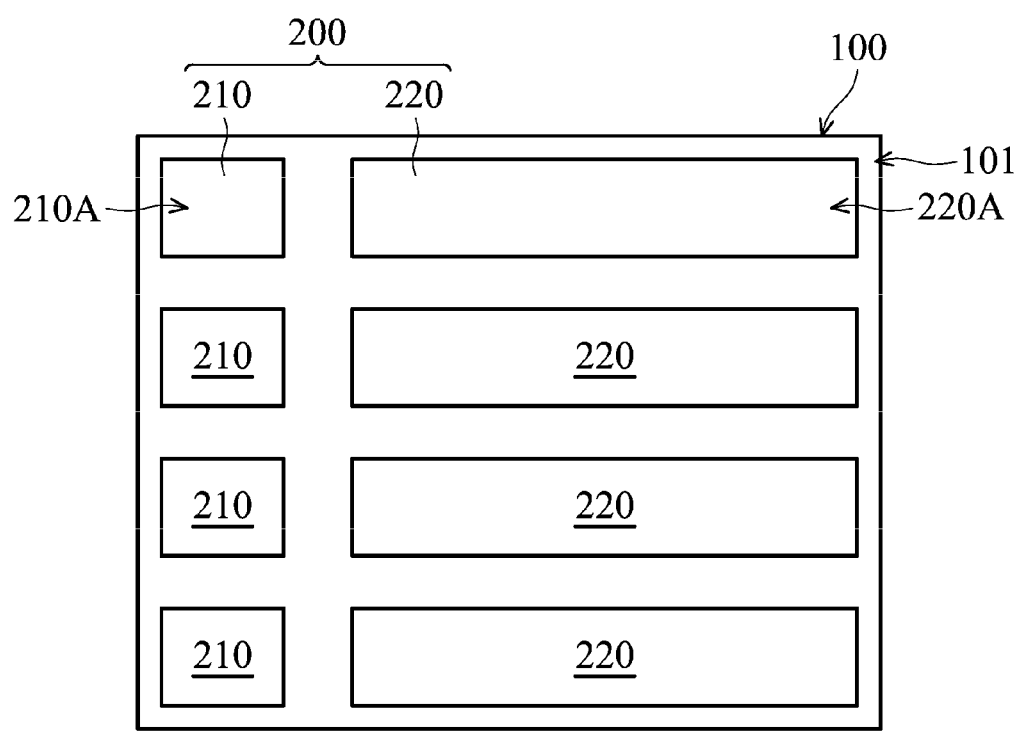
FIGS. 2 to 4 and 5A are top-views of various exemplary embodiments of a semiconductor chip structure according to the invention.

Referring to FIG. 2, in the embodiment, the semiconductor chip structure may have four pairs of electrodes 200 spaced apart from each other. Each pair of electrodes 200 comprises a P-type thermoelectric cooling material layer 210 and an N-type thermoelectric cooling material layer 220. The thermoelectric cooling material layers 210 and 220 are arranged in a 2×4 matrix on the surface 101 of the semiconductor chip 100. The thermoelectric cooling material layers 210 and 220 arranged in the same column have the same conductivity type, and the thermoelectric cooling material layers 210 and 220 arranged in the same row have different conductivity types. In one embodiment, the P-type thermoelectric cooling material layer 210 and the N-type thermoelectric cooling material layer 220 are rectangular columns having a length L and a contact area A, as shown in FIG. 6. In other embodiments, the P-type thermoelectric cooling material layer 210 and the N-type thermoelectric cooling material layer 220 may be oval columns, rounded rectangle columns or polygon columns (not shown).

In the embodiment, the P-type thermoelectric cooling material layer 210 and the N-type thermoelectric cooling material layer 220 have a contact area 210A and a contact area 220A, respectively. The contact area 210A is less than the contact area 220A. In another embodiment, the contact area 210A may be equal to or greater than the contact area 220A.

Referring to FIG. 3, in the embodiment, the semiconductor chip structure may have only one pair of electrodes 200, and the contact area 210A of the P-type thermoelectric cooling material layer 210 is equal to the contact area 220A of the N-type thermoelectric cooling material layer 220. In another embodiment, the contact area 210A may be different from the contact area 220A. When the contact area 210A of the P-type thermoelectric cooling material layer 210 is equal to the contact area 220A of the N-type thermoelectric cooling material layer 220, the heat dissipation performance is better.

Referring to FIG. 4, in the embodiment, the semiconductor chip structure may have eight pairs of electrodes 200 comprising a P-type thermoelectric cooling material layer 210 and an N-type thermoelectric cooling material layer 220, respectively. The thermoelectric cooling material layers 210 and 220 are arranged in a 4×4 matrix on the surface 101 of the semiconductor chip 100, and have the same contact area 210A and 220A. Two adjacent thermoelectric cooling material layers arranged in the same column have different conductivity types, and two adjacent thermoelectric cooling material layers arranged in the same row have different conductivity types. In one embodiment, the semiconductor chip structure may be attached to other external wires or packages (not shown) by the adhesive layer 350 (not shown) to electrically connect the different pairs of electrodes 200.

Compared to the semiconductor chip structure of the embodiment in FIG. 3 which comprises only one pair of electrodes 200 having the same contact area, the semiconductor chip structure of the embodiment in FIG. 4 comprises a plurality of pairs of electrodes 200 spaced apart from each other and having the same contact area in the same unit area as that in FIG. 3. The thermoelectric cooling material layers 210 and 220 in FIG. 4 have a current density that is more uniform than that in FIG. 3, such that the effective area for heat absorption is relatively greater. As a result, the used-area percentage of the thermoelectric cooling material can be increased by the plurality of pairs of electrodes 200, thereby improving the heat absorption capability and further reducing the inner temperature of the semiconductor chip structure.

It is realized that the number, the shape, the size of the contact area and the arrangements of the P-type thermoelectric cooling material layer 210 and the N-type thermoelectric cooling material layer 220 shown in FIGS. 2 to 4 are illustrated as examples and not limited thereto. The actual number, shape, size of the contact area and arrangements of the P-type thermoelectric cooling material layer 210 and the N-type thermoelectric cooling material layer 220 are determined by design demands.

Referring to FIGS. 5A and 5B, a top-view and a cross-sectional view of another exemplary embodiment of a semiconductor chip structure according to the invention are illustrated. The semiconductor chip structure shown in FIGS. 5A and 5B is similar to that shown in FIG. 4. The differences therebetween are that the adhesive layer 350 of the semiconductor chip structure shown in FIGS. 5A and 5B is connected to the P-type thermoelectric cooling material layer 210 and the N-type thermoelectric cooling material layer 220 of different pairs of electrodes 200 so as to form electrical connection between the different pairs of electrodes 200. Accordingly, the semiconductor chip structure can serve as an independent device, and does not need to be additionally connected to other external wires or packages.

According to the embodiments, the cold-ends of the thermoelectric cooling material layers 210 and 220 within the electrodes 200 are adjacent to the surface 101 of the semiconductor chip 100 which is adjacent to the thermal conductive layer 110, such that the heat can be conducted from the interior of the semiconductor chip structure to the cold-ends of the thermoelectric cooling material layers 210 and 220. Moreover, the heat can be further conducted to the hot-ends of the thermoelectric cooling material layers 210 and 220 by the active heat conduction. As a result, the heat is quickly conducted outward from the interior of the semiconductor chip structure, thereby efficiently reducing the inner temperature of the semiconductor chip structure. Accordingly, even if the semiconductor flip chip structure is overdriven, the high efficiency of the semiconductor flip chip structure is maintained, and the lifespan thereof is increased.

While the invention has been described by way of example and in terms of preferred embodiment, it is to be understood that the invention is not limited thereto. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A semiconductor chip structure, comprising:
a semiconductor chip having a pair of electrodes, wherein the electrodes have different conductivity types for electrical connection; and
a thermoelectric cooling material layer disposed within each of the pair of electrodes;
wherein an operating current $I_{opt}$ applied to each of the thermoelectric cooling material layers is in a range of $$\frac{\alpha T_c - \sqrt{(\alpha T_c)^2 - 2k\rho\, \Delta T}}{\rho} < I_{opt} \times L/A < \frac{\alpha T_c + \sqrt{(\alpha T_c)^2 - 2k\rho\, \Delta T}}{\rho},$$

and wherein L represents a length of the thermoelectric cooling material layer, A represents a contact area of the thermoelectric cooling material layer, $T_c$ represents a cold-end temperature, $T_h$ represents a hot-end temperature, $\alpha$ represents a seeback coefficient, $\rho$ represents a resistivity of the thermoelectric cooling material layer, k represents a thermal conductivity of the thermoelectric cooling material layer, and $\Delta T$ represents a temperature difference between $T_c$ and $T_h$.

2. The semiconductor chip structure as claimed in claim 1, wherein the pair of electrodes comprises a P-type electrode and an N-type electrode.

3. The semiconductor chip structure as claimed in claim 2, wherein the P-type electrode and the N-type electrode comprise a wire layer.

4. The semiconductor chip structure as claimed in claim 3, wherein the P-type electrode and the N-type electrode further comprise an adhesive layer.

5. The semiconductor chip structure as claimed in claim 4, wherein the adhesive layer comprises a single layer or multiple layers.

6. The semiconductor chip structure as claimed in claim 4, wherein each of the thermoelectric cooling material layers is interposed between the wire layer and the adhesive layer.

7. The semiconductor chip structure as claimed in claim 6, wherein the wire layer and the adhesive layer have different temperatures.

8. The semiconductor chip structure as claimed in claim 1, further comprising a power unit electrically connected to the P-type electrode and the N-type electrode to construct a same electrical circuit.

9. The semiconductor chip structure as claimed in claim 1, wherein the semiconductor chip is a light-emitting diode chip or a high-voltage flip chip.

10. The semiconductor chip structure as claimed in claim 1, wherein the thermoelectric cooling material layers comprise BiSb, $Bi_2Te_3$, PbTe, $CeFe_{4-x}Co_xSb_{12}$ or SiGe.

* * * * *